(12) United States Patent
Tsai

(10) Patent No.: US 7,501,311 B2
(45) Date of Patent: Mar. 10, 2009

(54) FABRICATION METHOD OF A WAFER STRUCTURE

(75) Inventor: Chi-Long Tsai, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 32 days.

(21) Appl. No.: 11/183,833

(22) Filed: Jul. 19, 2005

(65) Prior Publication Data

US 2006/0094223 A1    May 4, 2006

(30) Foreign Application Priority Data

Nov. 3, 2004    (TW) ............................... 93133451 A

(51) Int. Cl.
*H01L 21/00* (2006.01)

(52) U.S. Cl. ........................ 438/114; 438/113; 438/458; 438/460; 438/462; 257/620; 257/E21.508; 257/E21.599

(58) Field of Classification Search ................ 438/113, 438/114, 115, 458, 460, 462, 463, 465; 257/620, 257/E21.508, E21.599
See application file for complete search history.

(56) References Cited

U.S. PATENT DOCUMENTS

| 6,287,893 | B1 * | 9/2001 | Elenius et al. ............... 438/108 |
| 6,338,980 | B1 * | 1/2002 | Satoh .......................... 438/106 |
| 6,849,534 | B2 * | 2/2005 | Ho et al. ...................... 438/614 |
| 6,974,726 | B2 * | 12/2005 | Dani et al. ................... 438/114 |
| 7,279,362 | B2 * | 10/2007 | Li et al. ....................... 438/114 |
| 2003/0168254 | A1 * | 9/2003 | Kariya et al. ............... 174/261 |
| 2003/0216025 | A1 * | 11/2003 | Lu et al. ..................... 438/614 |
| 2004/0155334 | A1 * | 8/2004 | Honda ......................... 257/734 |
| 2004/0217150 | A1 * | 11/2004 | Teutsch et al. .............. 228/191 |
| 2005/0139962 | A1 * | 6/2005 | Dani et al. ................... 257/620 |
| 2005/0179131 | A1 * | 8/2005 | Homma ....................... 257/737 |

* cited by examiner

*Primary Examiner*—W. David Coleman
*Assistant Examiner*—Su C Kim
(74) *Attorney, Agent, or Firm*—Bacon & Thomas PLLC

(57) ABSTRACT

A wafer fabricating method at least includes the steps of providing a wafer having an active surface with a plurality of pads, forming a plurality of bumps on the pad, and forming an organic protective layer on the bump and the active surface. Besides improving the quality of the wafer, the wafer structure according to the invention is oxidation-resistant, thus avoiding the cold-joint problem when soldered to the substrate.

15 Claims, 6 Drawing Sheets

FABRICATION METHOD OF A WAFER STRUCTURE

This application claims the benefit of Taiwan application Serial No. 93133451, filed Nov. 3, 2004, the subject matter of which is incorporated herein by reference.

BACKGROUND OF THE INVENTION

1. Field of the Invention

The invention relates in general to a fabricating method of a wafer structure, and more particularly to a fabricating method of an oxidation-resistant wafer structure.

2. Description of the Related Art

Referring to FIG. 1, cross-sectional view of a conventional wafer structure is shown. Conventional wafer structure 10 includes a wafer 11, a conductive structure, an organic protective layer 13, an under bump metallurgy layer (UBM layer) 14 and a conductive bump 15. The conductive structure, a pad 12 for example, is positioned on the surface of the wafer 11. The organic protective layer 13 covers the wafer 11 and part of the pad 12 to expose the surface of the pad 12. The UBM layer 14 is connected to the surface of the pad 12 to enhance the surface bonding between the conductive bump 15 and the pad 12. The conductive bump 15, which is formed on the UBM layer 14, is made of lead-tin alloy with a lead/tin ratio of 95/5 or 97/3.

However, the surface of the high lead bump is easily oxidized to form an oxide layer on the surface of the bump. When the bump is bonded to an external component such as a substrate or a circuit board, the cold joint would easily occur, resulting in poor soldering of the product.

SUMMARY OF THE INVENTION

It is therefore the object of the invention to provide an oxidation-resistant wafer structure. Besides improving the quality of the wafer, the wafer structure according to the invention also avoids the cold-joint problem due to oxidation when the wafer structure is soldered to a substrate.

According to the object of the invention, a wafer fabricating method is provided. The method at least includes the steps of providing a wafer having an active surface, forming a number of bumps on the pads, and forming an organic protective layer on the bump. The active surface has a number of pads.

According to the object of the invention, another fabricating method of a flip-chip package is provided. The method includes the steps of providing a chip having an active surface with a number of bumps, forming an organic protective layer on the bump and the active surface, using a solvent to remove the organic protective layer on the chip, and soldering a chip onto a substrate.

Other objects, features, and advantages of the invention will become apparent from the following detailed description of the preferred but non-limiting embodiments. The following description is made with reference to the accompanying drawings.

DETAILED DESCRIPTION OF THE INVENTION

The invention provides a fabricating method of flip-chip package and the structure thereof. The fabricating method of flip-chip package according to the invention at least includes the following steps. At first, a chip having an active surface is provided. The active surface has several pads. Next, several bumps are correspondingly formed on the above pads. Then, an organic protective layer is formed on both the bump and the active surface. Then, the chip is overturned on the substrate, so that the organic protective layer disposed on the bumps contacts the substrate. Next, the organic protective layer is removed according to a flux draped on the bump. Then, the flux is re-flown for the bump to be adhered onto the pad disposed on the substrate. At last, a type of glue is filled among the organic protective layer, the chip and the substrate. A number of embodiments are disclosed below. However, the scope of protection of the invention is not limited thereto.

First Embodiment

Figure 1:
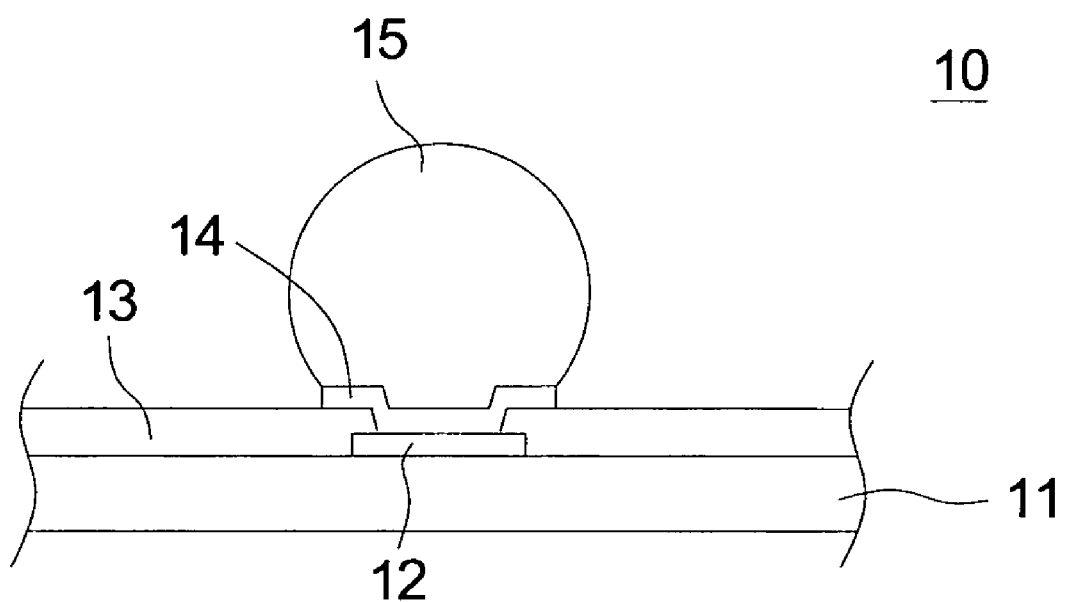
FIG. 1 (Prior Art) is a cross-sectional view of a conventional wafer structure.
Figure 2A:
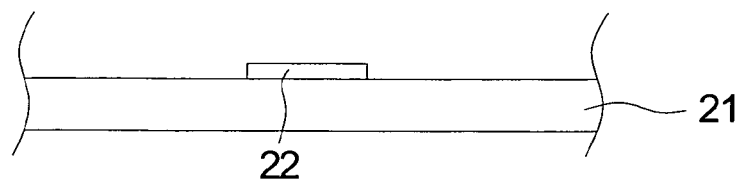
FIG. 2A~2L are diagrams of a fabricating method of a flip-chip package according to a first embodiment of the invention.
Figure 2B:
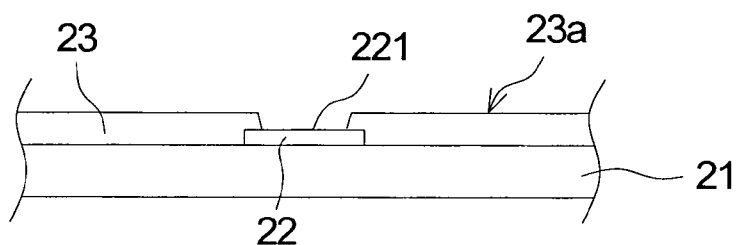

Referring to FIG. 2A~2J, diagrams of a fabricating method of a flip-chip package according to a first embodiment of the invention are shown. At first, as shown in FIG. 2A, a wafer 21 is provided. The wafer 21 has a conductive structure such as a pad 22, normally made of copper or aluminum, disposed thereon to form an electrical connection with an external circuit. Next as shown in FIG. 2B, an organic protective layer 23 is applied on the wafer 21. The organic protective layer protects the wafer structure and flattens the surface. The organic protective layer 23 does not cover the entire pad 22 for a conductive surface 221 of the pad 22 to be exposed. Meanwhile, a wafer 21 having an active surface 23a is provided. The active surface 23a has several pads 22 disposed thereon.

Figure 2C:
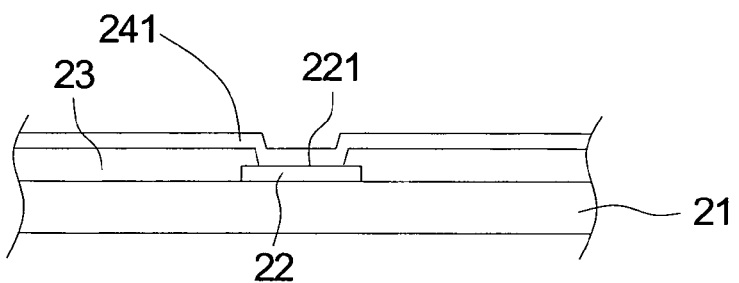
Figure 2D:
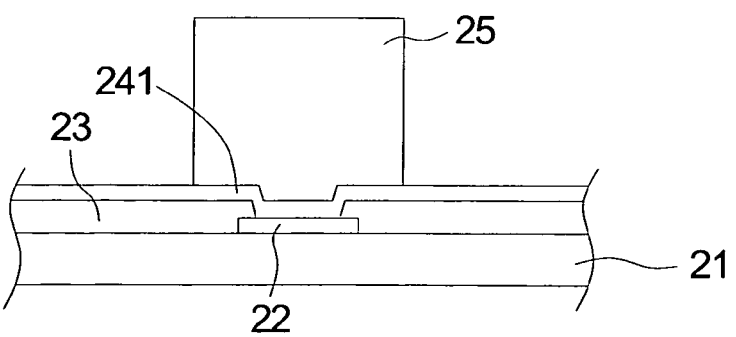
Figure 2E:
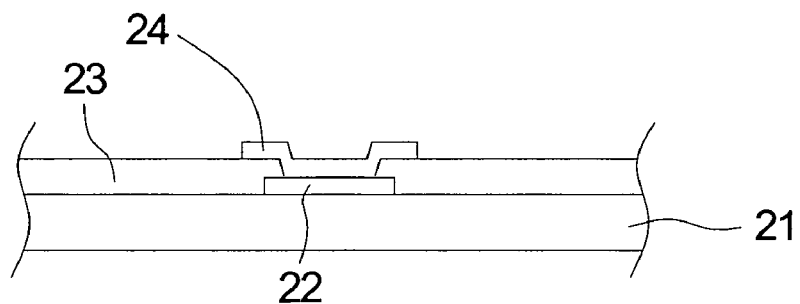
Figure 2F:
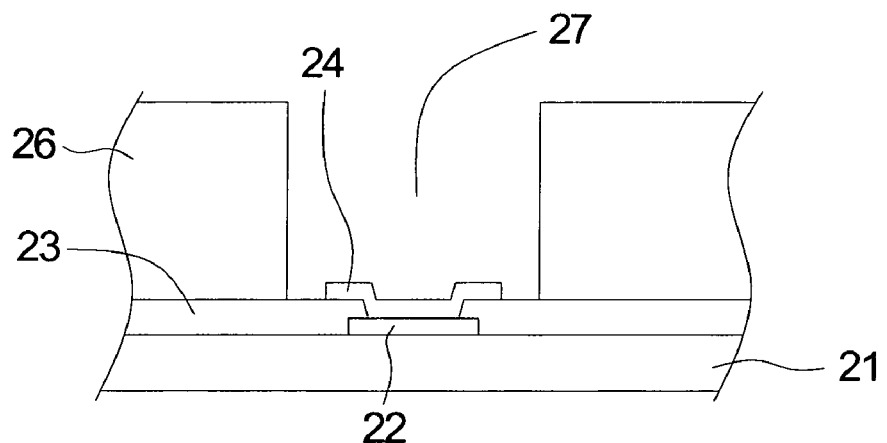
Figure 2G:
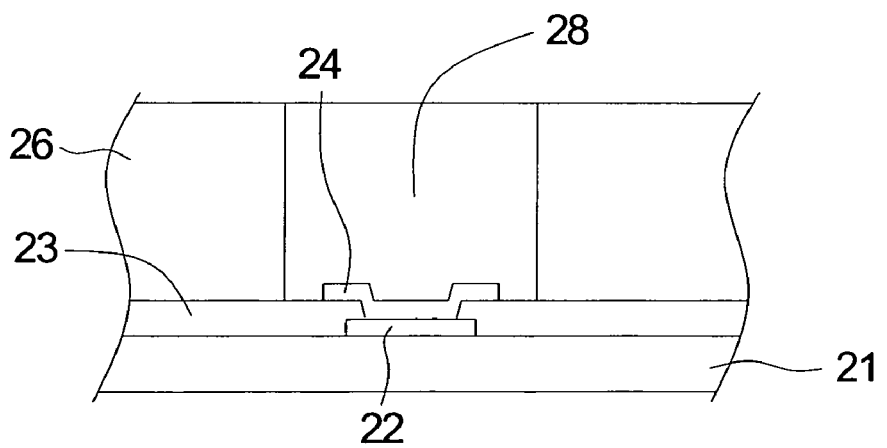
Figure 2H:
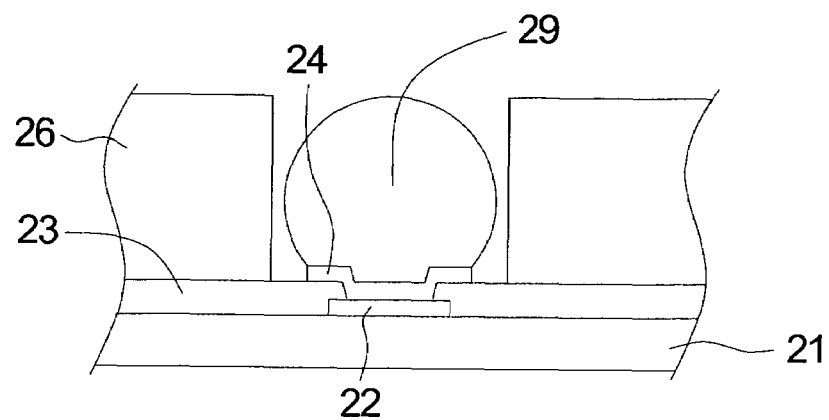
Figure 2I:
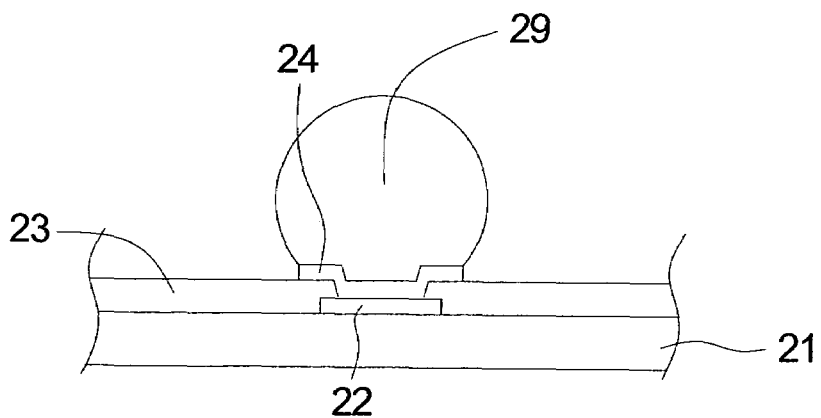

Then, as shown in FIG. 2C, a conductive layer 241 is formed on the surface of the organic protective layer 23 and the pad 22 by using a sputtering method. Next, as shown in FIG. 2D, the conductive layer 241 is covered with a photo-resist layer such as a layer of dry film or liquid photo-resistant. According to an appropriate processing, a patterned-layer shifting method for instance, an aperture 27 (shown in FIG. 2F) is defined on the photo-resist layer, part of the photo-resist layer is removed, and a patterned photo-resist layer 25 is still disposed on the aperture 27. Next, as shown in FIG. 2E, the patterned photo-resist layer 25 is used as a mask so as to etch and pattern the conductive layer 241. For example, an under bump metallurgy (UBM) layer 24 is formed according to the wet etching method by removing the conductive layer 241 except the part of the conductive layer disposed on the aperture. Then, the patterned photo-resist layer 25 is removed. The UBM layer 24 normally includes an adhesion layer, a barrier layer and a moisture layer. The adhesion layer, which provides adhesion for bonding the pad and the organic protective layer, can be made of aluminum, titanium, chromium, or tungsten-titanium alloy. The barrier layer, which prevents the metal diffusion between the solder ball and the pad, can be made of nickel vanadium, or nickel. The moisture layer, which improves the draping between the UBM layer 24 and the solder ball, can be made of copper, molybdenum, or platinum. Then, the surface is covered with another photo-resist layer 26 except the aperture 27 for the conductive bump to be formed via the patterned-layer shifting, as shown in FIG. 2F. As shown in FIG. 2G, the aperture 27 is filled with a solder paste 28 according to the printing method. Next as shown in FIG. 2H, the solder paste 28 is re-flown to form a conductive bump 29. Meanwhile, the conductive bump 29 is correspondingly formed on the pad 22.

Figure 2J:
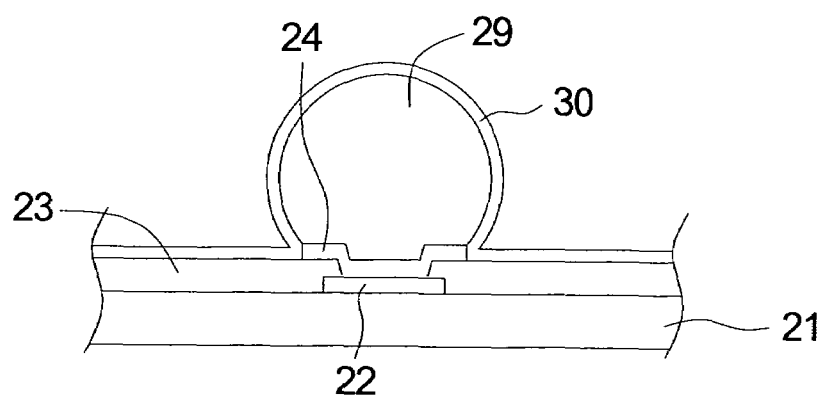

Subsequently, the photo-resist layer 26 is removed to form a organic protective layer 30 on the conductive bump 29 and the active surface, so that a wafer structure 20 is obtained as shown in FIG. 2J. The organic protective layer 30 can be formed according rotary coating, physical and chemical depositing, printing, draping, or spraying. The wafer structure 20 is completed here.

Referring to FIG. 2J, a cross-sectional view of a wafer structure according to the first embodiment of the invention is shown. The wafer structure 20 according to the present embodiment includes a wafer 21, a conductive structure, an organic protective layer 23, a UBM layer and a conductive bump 29. The conductive structure, such as a pad 22, is disposed on wafer 21. The organic protective layer 23 covers the wafer 21 and part of the pad 22 to expose a surface of the pad 21. The UBM layer 24 covers the surface of the pad 22 and part of the surface of the organic protective layer 23. The UBM layer 24 is made of an adhesion layer, a barrier layer and a moisture layer to enhance the bonding between the conductive bump 34 and the surface of the pad 22. The conductive bump 29 is positioned on the UBM layer 31. The conductive bump 29 is made of lead-tin alloy with a lead/tin ratio of 95:5 or 97:3 for instance. The organic protective layer 30 covers the active surface 23a of the wafer and the bump 29.

Furthermore, the organic protective layer 30 is a layer of organic solderability preservatives (OSP) for instance. Besides, the thickness of the organic protective layer ranges from 1000~2000 Å, and preferably, 1500 Å.

Figure 2K:
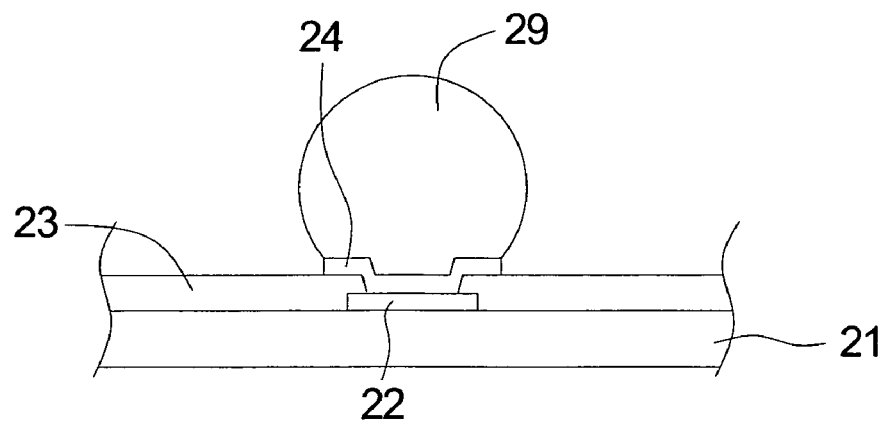
Figure 2L:
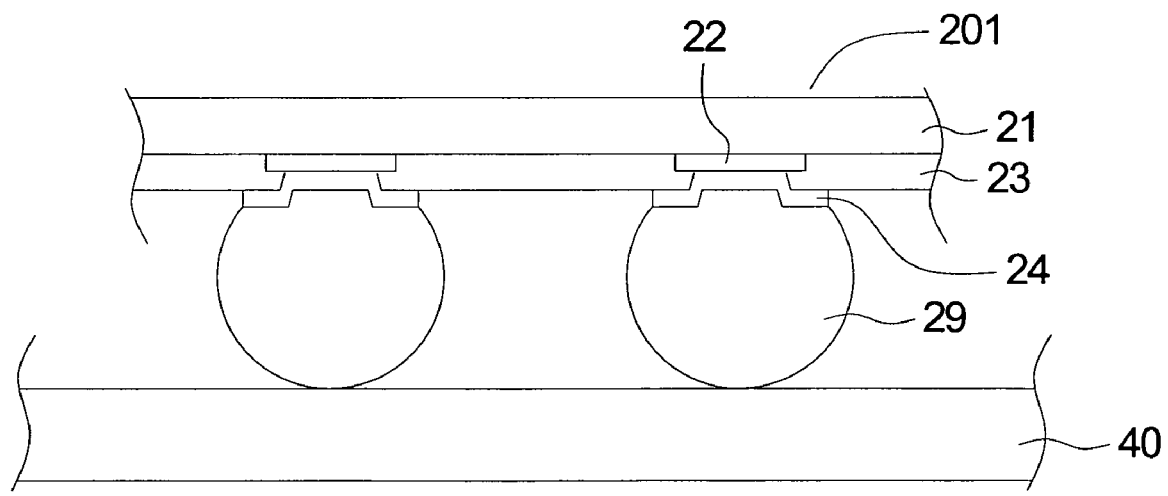

After the wafer structure is formed, the wafer is diced into several chips. A solvent, such as a flux, is used to remove the organic protective layer 30 disposed on the chip 201 as shown in FIG. 2K. A draping flux is applied on the surface of the organic protective layer 30 of the chip 201 to dissolve the organic protective layer 30. Next, as shown in FIG. 2L, the chip 201 is overturned on a substrate 40 or a circuit board, so that the bump 29 on the chip 201 contacts the substrate 40. Next, the chip 201 and the substrate 40 are soldered together. At last, the clearance among the bump 29, the chip 201 and the substrate 40 is filled with glue.

Despite the invention is exemplified by the above embodiment, the method of using a solvent to remove the flux is not limited thereto. For example, a solvent can be applied on the substrate. Next, the flip-chip is overturned on the substrate, so that the organic protective layer disposed on the bump contacts the substrate. At last, the organic protective layer is dissolved by the solvent.

Second Embodiment

The invention is also applicable to a wafer structure having a copper bump and the flip-chip package structure thereof. The present embodiment differs with the above embodiment only in the material of the bump and the range covered by the organic protective layer, while the other components are the same. The wafer structure and the fabricating method thereof are exemplified below. The subsequent flip-chip package method still remains the same and is not illustrated in the present embodiment.

Figure 3A:
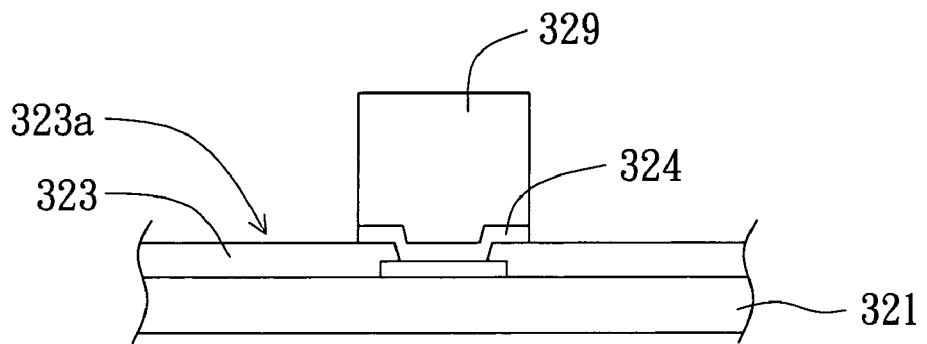
FIG. 3A~3C are diagrams of a fabricating method of a wafer structure according to a second embodiment of the invention.
Figure 3B:
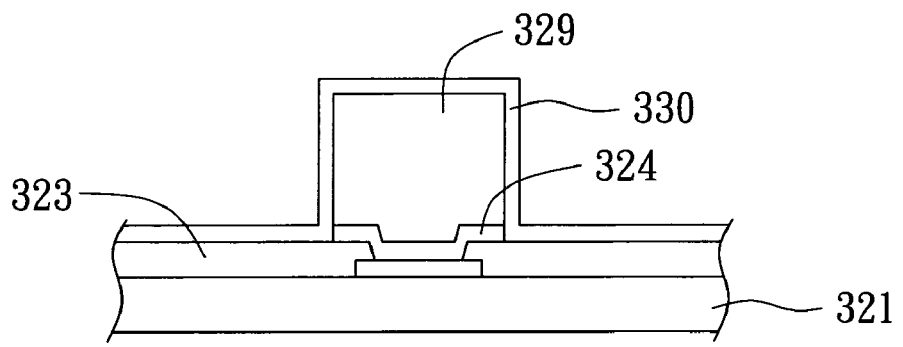
Figure 3C:
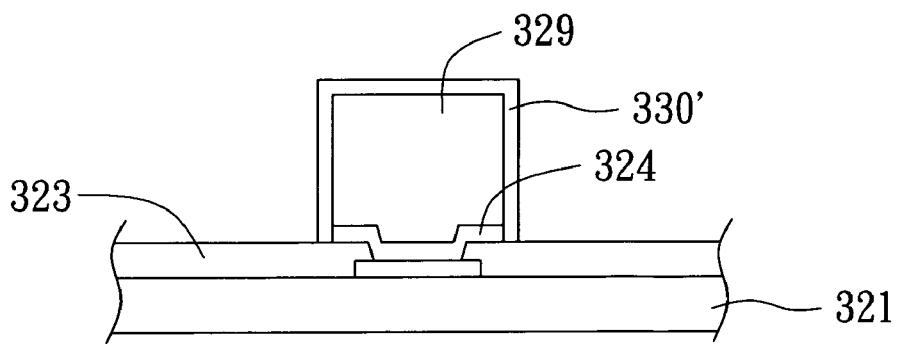

Referring to FIG. 3A~3C, diagrams of a fabricating method of a wafer structure according to a second embodiment of the invention are shown. At first, a wafer 321 is provided. The active surface 323a of the wafer 321 has an organic protective layer 323 and a under bump metallurgy (UBM) layer 324. The bump of the UBM layer 324 is preferably a copper bump 329 formed on the UBM layer 324 as shown in FIG. 3A. The copper bump 329 is preferably a copper post which can be formed through the following steps for example. At first, the active surface of the wafer covered with a metal copper layer. Next, a photo-resist layer is formed on the metal copper layer, which is exposed and developed to form a patterned photo-resist layer whereby the metal copper layer is patterned and formed on the UBM layer. Next, an organic protective layer 330 is formed on the copper bump 329 and the active surface as shown in FIG. 3B. Besides, the thickness of the organic protective layer 330 ranges from 1000~2000 Å. Preferably, the thickness of the organic protective layer 330 is 1500 Å. Then, preferably part of the organic protective layer 330 is removed, so that the organic protective layer 330' only covers the copper bump 329 for the wafer structure 320 to be manufactured as shown in FIG. 3C. It is noteworthy that the organic protective layer 330' covers the surface of the copper bump 329 protects the copper bump 329 and prevents the metal copper from being oxidized.

After the wafer structure 320 is manufactured, the wafer 321 is diced into several chips for the formation of subsequent flip-chip package. The fabricating method of flip-chip package is the same as the above embodiment. At first, a solvent is used to remove the organic protective layer 330'. Then, corresponding chips are soldered onto the plate, and the glue is filled between the chip and the plate. The flip-chip package is completed here.

Preferably, the organic protective layer 330' is an organic solderability preservatives (OSP) layer, and the solvent used to remove the organic protective layer 330' is preferably flux. It is noteworthy that, when the copper bump 329 is formed, the organic protective layer 330' covers the surface of the copper bump 329 to prevent the copper bump 329 from being oxidized until the flux is draped. By doing so, the cold joint problem between the copper bump 329 and the plate is avoided, so that the yield rate of soldering between the chip and the plate is improved.

The wafer structure disclosed in above embodiments is oxidation-resistant. Besides improving the quality of the wafer, the wafer structure according to the invention also avoids the cold-joint problem due to oxidation when the wafer structure is soldered to a substrate. Thus the quality of bonding between the wafer and the plate is further improved and an even better effect of electrical conductivity is achieved.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A fabricating method of a flip-chip package, comprising the steps of:

provideing a chip having an active surface, wherein the active surface has a plurality of bumps;

forming an organic protective layer on the bumps and the active surface;

removing the organic protective layer disposed on the chips by a flux, wherein the organic protective layer prevents the bump from being oxidized until the flux is applied thereon; and soldering the chip onto a substrate after the organic protective layer of the chip has been removed.

2. The fabricating method according to claim 1, wherein the step of using a flux to remove the organic protective layer further comprises:

applying a flux on the substrate;

overturning the chip on the substrate, so that the organic protective layer disposed on the bumps contacts the substrate; and dissolving the organic protective layer by the flux.

3. The fabricating method according to claim 1, wherein the step of using a flux to remove the organic protective layer further comprises:

draping a flux on the surface of the bump;

dissolving the organic protective layer by the flux; and overturning the chip on the substrate, so that the organic protective layer disposed on the bumps contacts the substrate.

4. The fabricating method according to claim 1, wherein the organic protective layer is a layer of organic solderability preservatives (OSP).

5. The fabricating method according to claim 1, wherein the thickness of the organic protective layer ranges from 1000~2000 Å.

6. The fabricating method according to claim 1, wherein the thickness of the organic protective layer is 1500 Å.

7. The fabricating method according to claim 1, wherein the bumps are made of copper.

8. The fabricating method according to claim 1, wherein the bumps are made of lead-tin alloy.

9. A fabricating method of a flip-chip package, comprising the steps of:

(a) providing a chip having an active surface, wherein the active surface has a plurality of bumps;

(b) forming an organic protective layer on the bumps and the active surface;

(c) applying a flux on the substrate;

(d) overturning the chip on the substrate after the organic protective layer and the flux are formed on the bumps and the substrate respectively, so that the organic protective layer disposed on the bumps contacts with the flux applied on the substrate; and (e) dissolving the organic protective layer on the bumps by the flux on the substrate after the organic protective layer formed on the bumps contacts with the flux applied on the substrate; and (f) soldering the chip onto a substrate after the organic protective layer is dissolved by the flux, wherein the step (f) of soldering the chip onto the substrate is performed after the steps of (b), (c), (d) and (e).

10. The fabricating method according to claim 9, wherein the bumps are made of copper.

11. The fabricating method according to claim 9, wherein the bumps are made of lead-tin alloy.

12. The fabricating method according to claim 9, wherein the organic protective layer is a layer of organic solderability preservatives (OSP).

13. The fabricating method according to claim 9, wherein a thickness of the organic protective layer ranges from 1000~2000 Å.

14. The fabricating method according to claim 9, wherein a thickness of the organic protective layer is 1500 Å.

15. The fabricating method according to claim 9, wherein the step of forming the organic protective layer is selected from group consisting rotary coating, physical and chemical depositing, printing, draping or spraying.

* * * * *